(12) United States Patent
Granig et al.

(10) Patent No.: US 9,606,194 B2
(45) Date of Patent: Mar. 28, 2017

(54) OFF-CENTER ANGLE MEASUREMENT SYSTEM

(71) Applicant: Infineon Technologies AG, Neubiberg (DE)

(72) Inventors: Wolfgang Granig, Sachsenburg (AT); Dirk Hammerschmidt, Villach (AT); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 14/286,607

(22) Filed: May 23, 2014

(65) Prior Publication Data

US 2014/0253106 A1 Sep. 11, 2014

Related U.S. Application Data

(63) Continuation-in-part of application No. 13/267,534, filed on Oct. 6, 2011, now Pat. No. 8,736,257, which is a continuation of application No. 12/206,410, filed on Sep. 8, 2008, now Pat. No. 8,058,866.

(51) Int. Cl.
| | | |
|---|---|---|
| *G01B 7/30* | (2006.01) | |
| *G01R 33/06* | (2006.01) | |
| *G01D 5/14* | (2006.01) | |

(52) U.S. Cl.
CPC ............ *G01R 33/06* (2013.01); *G01D 5/145* (2013.01)

(58) Field of Classification Search
CPC ........ G01D 5/145; G01D 5/147; G01R 33/09; G01R 33/093; G01B 7/033
See application file for complete search history.

(56) References Cited

U.S. PATENT DOCUMENTS

| | | |
|---|---|---|
| 6,304,074 B1 | 10/2001 | Waffenschmidt |
| 6,433,537 B1 | 8/2002 | Petersen |
| 6,448,763 B1 | 9/2002 | Spellman |
| 6,640,652 B2 | 11/2003 | Kikuchi et al. |
| 6,927,566 B2 | 8/2005 | Apel et al. |
| 7,064,537 B2 | 6/2006 | Sudo et al. |

(Continued)

OTHER PUBLICATIONS

Office Action mailed Jan. 19, 2011 relative to U.S. Appl. No. 12/206,410.

(Continued)

*Primary Examiner* — Minh N Tang
(74) *Attorney, Agent, or Firm* — Dicke, Billig & Czaja, PLLC

(57) ABSTRACT

A method for measuring an angular position of a rotating shaft, the method including providing a magnetic field which rotates with the shaft about an axis of rotation, positioning an integrated circuit having first and second magnetic sensing bridges within the magnetic field at a radially off-center position from the axis of rotation, the first and second magnetic sensing bridges respectively providing first and second signals representative of first and second magnetic field directions, the integrated circuit having a set of adjustment parameters for modifying attributes of the first and second signals, modifying values of the set of adjustment parameters until errors in the first and second signals are substantially minimized, and determining an angular position of the shaft based on the first and second signals.

13 Claims, 11 Drawing Sheets

(56) References Cited

U.S. PATENT DOCUMENTS

| | | | |
|---|---|---|---|
| 7,095,596 B2 | 8/2006 | Schmollngruber et al. | |
| 7,405,560 B2 | 7/2008 | Shimizu | |
| 7,423,420 B2 | 9/2008 | Meyersweissflog | |
| 7,466,125 B2 | 12/2008 | Heinze et al. | |
| 7,472,004 B2 | 12/2008 | Hara et al. | |
| 8,736,257 B2 * | 5/2014 | Granig | G01D 5/145 324/207.21 |
| 2005/0030012 A1 | 2/2005 | Kunz-Vizenetz | |
| 2006/0028203 A1 | 2/2006 | Kawashima et al. | |
| 2008/0012558 A1 * | 1/2008 | Rossler | B82Y 25/00 324/252 |
| 2008/0297181 A1 | 12/2008 | Ausserlechner | |
| 2009/0115405 A1 | 5/2009 | Guo et al. | |
| 2010/0050731 A1 | 3/2010 | Granig et al. | |

OTHER PUBLICATIONS

Notice of Allowance mailed Jan. 16, 2014 in U.S. Appl. No. 13/267,534.

* cited by examiner

OFF-CENTER ANGLE MEASUREMENT SYSTEM

CROSS-REFERENCE TO RELATED APPLICATIONS

This application is a continuation-in-part of patent application Ser. No. 13/267,534, filed on Oct. 6, 2011, now U.S. Pat. No. 8,736,257, which is a continuation of patent application Ser. No. 12/206,410, filed Sep. 8, 2008, now U.S. Pat. No. 8,058,866, both of which are incorporated herein by reference.

BACKGROUND

Magnetic sensing devices, such as Giant Magnetoresistance (GMR) sensors, for example, are used in a wide variety of applications. For example, GMR sensors are often used for sensing the angular position of a rotating member, such as a motor shaft. In such applications, a permanent magnet, sometimes referred to as a "pill", is typically mounted to or embedded in an end of the motor shaft and is centered on the axis of rotation. The GMR elements or resistors, which are typically connected to form one or more bridges, are also positioned so as to be centered on the axis of rotation, with the resulting output signals generated by the GMR resistors being indicative of the angular position of the rotating shaft.

However, for many reasons, such as space limitations, for example, it may not always be possible or desirable to position an angle sensor, such as a GMR sensor at the end of the rotating shaft. In such instances, toothwheels or polewheels are sometimes mounted to the rotating shaft and a magnetic sensor (e.g. a Hall effect sensor) are positioned proximate to the wheel and detect the passing of each tooth or pole to determine the angular position of the rotating shaft. However, while toothwheels and pole wheels are typically very accurate, they can be quite costly and provide only discrete (not continuous) location measurements as compared to magnetoresistive-based angle sensors, such as GMR type angle sensors, for example.

For these and other reasons, there is a need for the embodiments of the present disclosure.

SUMMARY

One embodiment provides a method for measuring an angular position of a rotating shaft. The method includes providing a magnetic field which rotates with the shaft about an axis of rotation, positioning an integrated circuit having first and second magnetic sensing bridges within the magnetic field at a radially off-center position from the axis of rotation, the first and second magnetic sensing bridges respectively providing first and second signals representative of first and second magnetic field directions, the integrated circuit having a set of adjustment parameters for modifying attributes of the first and second signals, modifying values of the set of adjustment parameters until errors in the first and second signals are substantially minimized, and determining an angular position of the shaft based on the first and second signals.

Another embodiment provides an integrated circuit for measuring an angular position of a magnetic object rotating around an axis from an off-axis position. The integrated circuit may include a plurality of magnetic sensing elements and a plurality of switches. The plurality of switches may be configured to select a first subset of one or more sensing elements out of the plurality of magnetic sensing elements. The subset of sensing elements may provide a first signal representative of a first directional component of a magnetic field caused by the rotating magnetic object.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
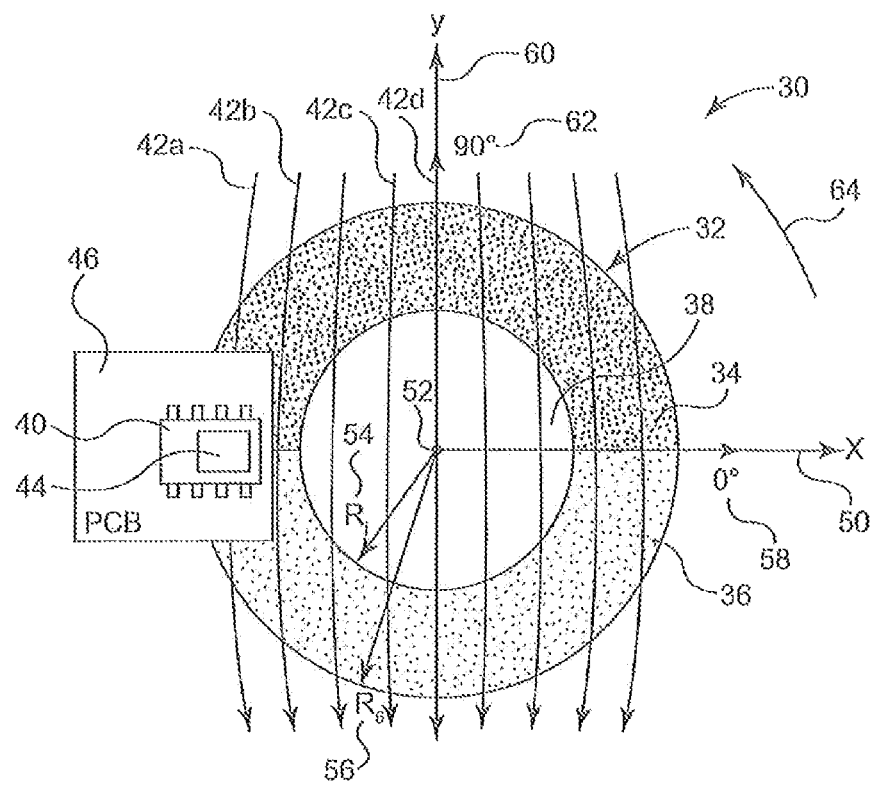
FIG. 1 is an end view of an off-center angle measurement system according to one embodiment.
Figure 2:
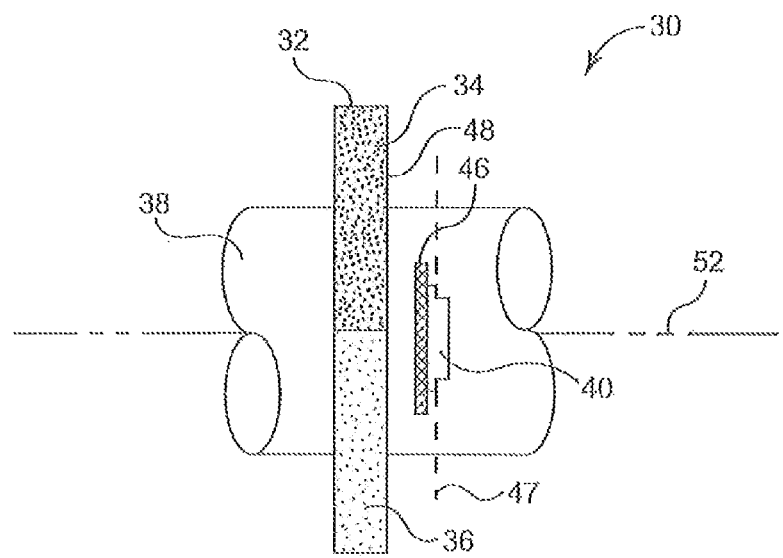
FIG. 2 is a side view of the off-center angle measurement system of FIG. 1.

FIGS. 1 and 2 respectively illustrate end and side views of an off-center GMR angle-measurement system 30 according to one embodiment which, as will be described in greater detail below, employs a plurality of adjustable GMR parameters to correct angle measurement errors caused by non-linear magnetic field lines.

It is to be understood that GMR type sensors are mentioned within this disclosure as a mere example of magnetic sensors, in particular angle sensors. Therefore the terms GMR sensor, GMR angle sensor and the like shall be construed as representing any known type of magnetic sensor or angle sensor, including but not limited to TMR sensors, AMR sensors, Hall sensors, vertical Hall sensors, horizontal Hall sensors. Likewise terms such as GMR resistor region, GMR sensor bridge, GMR amplitude parameter, GMR angle measurement system, or GMR parameter shall be construed as representing the corresponding resistor region, sensor bridge, amplitude parameter, angle measurement system, or parameters in any known type of magnetic sensor, or any known type of angle sensor.

According to one embodiment, off-center angle measuring system 30 includes a permanent ring magnet 32, divided equally into a north pole 34 (indicated by the "filled" area) and a south pole 36 (indicated by the "shaded" area), mounted on a rotating member 38, such as a rotating motor shaft, and a GMR angle sensor 40. A magnetic field of ring magnet 32 extends from north pole 34 to south pole 36, as indicated by magnetic field lines 42a through 42d.

A person of ordinary skill in the art will readily appreciate that more than one pair of north pole and south pole may be arranged along a circumferential direction of the permanent ring magnet 32. Such an arrangement would however lead to more than one period of sinus or cosine signals for a full rotation of the permanent magnet 32 providing a higher angular solution with regards to a change in angular position. As a tradeoff one would lose the option to distinguish an absolute angular position over a full turn of the rotating object. Which may however not be required in some applications.

According to one embodiment, GMR angle sensor 40 comprises a semiconductor chip having a GMR resistor region 44 (i.e. a "sensitive" region) mounted on a printed circuit board (PCB) 46. According to one embodiment, PCB 46 and thus, GMR angle sensor 40, are positioned in a plane 47 parallel to a surface 48 of ring magnet 32 such that resistor region 44 is substantially centered along an x-axis 50 extending through an axis of rotation 52 of rotating shaft 38 and between an inner radius (Ri) 54 and an outer radius (Ro) 56 of ring magnet 32. For purposes of the description herein, a 0-degree angular position of rotating shaft 38 is defined as being along x-axis 50, as indicated at 58, a 90-degree position is defined as being along y-axis 60 (perpendicular to and extending through axis of rotation 52), as indicated at 62, and so on. A direction of rotation of rotating shaft 38 is by rotational arrow 64.

Figure 3:
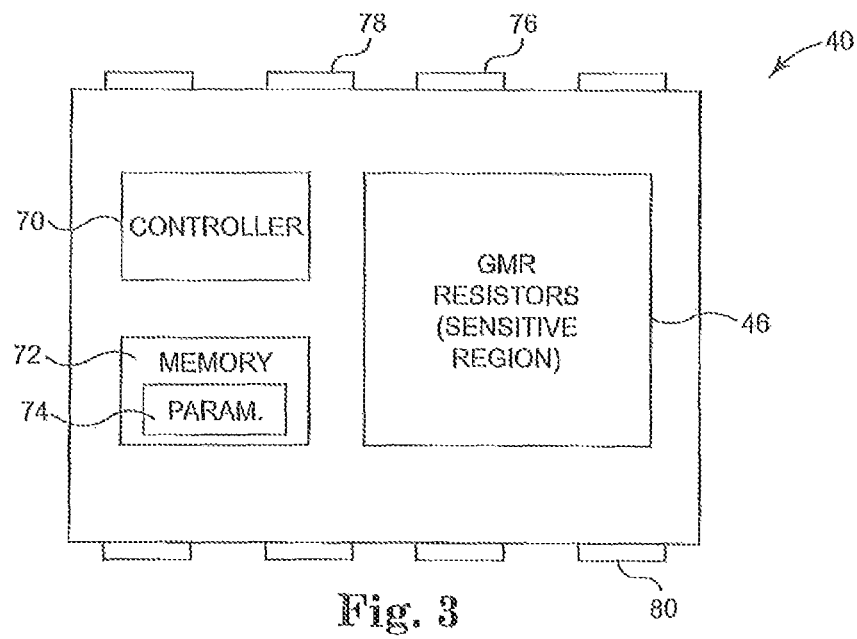
FIG. 3 a block diagram generally illustrating one embodiment of a GMR angle sensor suitable for use with the off-center angle measurement system of FIG. 1.

FIG. 3 is a block diagram generally illustrating one embodiment of GMR angle sensor 40 when configured as a semiconductor chip. As illustrated, in addition to GMR resistor region 44, GMR angle sensor 40 further includes a controller 70 and a memory 72, with memory 72 storing values for a plurality of GMR parameters 74, which will be described in greater detail below. GMR angle sensor 40 further includes a plurality of PINS, such as a supply voltage ($V_{DD}$) pin 76, a ground pin 78, and a data I/O pint 80.

Figure 4:
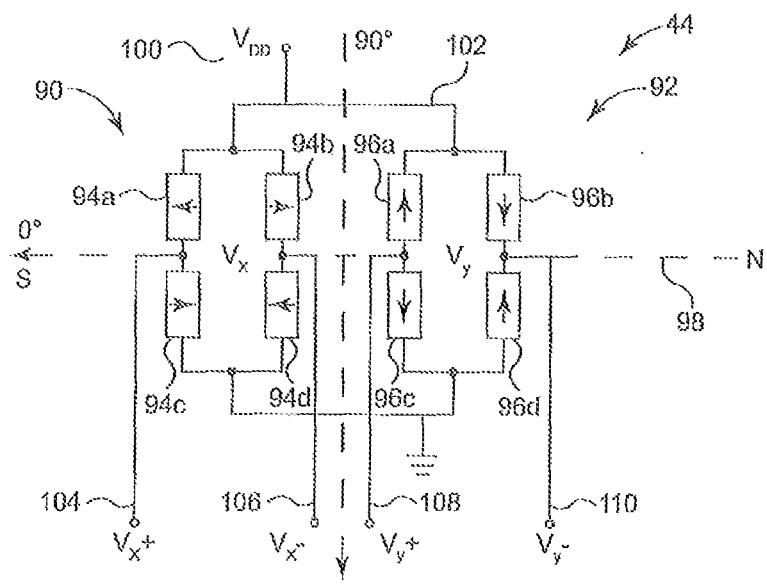
FIG. 4 is a schematic diagram generally illustrating a GMR resistor configuration according to one embodiment.

FIG. 4 is a schematic diagram generally illustrating GMR resistor region 44 according to one embodiment. As illustrated, GMR resistor region 44 includes a pair of GMR sensor bridges 90 and 92, with sensor bridge 90 formed by four GMR resistors 94a-94d and sensor bridge 92 formed by four GMR resistors 96a-96d. According to the bridge implementation of FIG. 4, GMR sensor bridges 90 and 92 are disposed orthogonal to one another and are respectively configured to sense an x-component and a y-component of a rotating magnetic field, such as the magnetic field indicated by the dashed lines at 98.

A supply voltage $V_{DD}$ 100 is applied to a terminal 102 via pin 76 and voltage signals $V_X+$ and $V_X-$ of GMR sensor bridge 90 are measured at terminals 104 and 106, and voltage signals $V_Y+$ and $V_Y-$ of GMR sensor bridge 92 are measured at terminals 108 and 110. In response to an external magnetic field, such as magnetic field 98, one or more of the GMR resistors 94a-94d and 96a-96d change in their electrical resistances, causing changes in voltage signals $V_X+$ and $V_X-$ at terminals 104 and 106 and voltage signals $V_Y+$ and $V_Y-$ at terminals 108 and 110 which are representative of an angular position of magnetic field 98 relative to a reference vector (e.g. 0-degrees).

Figure 5:
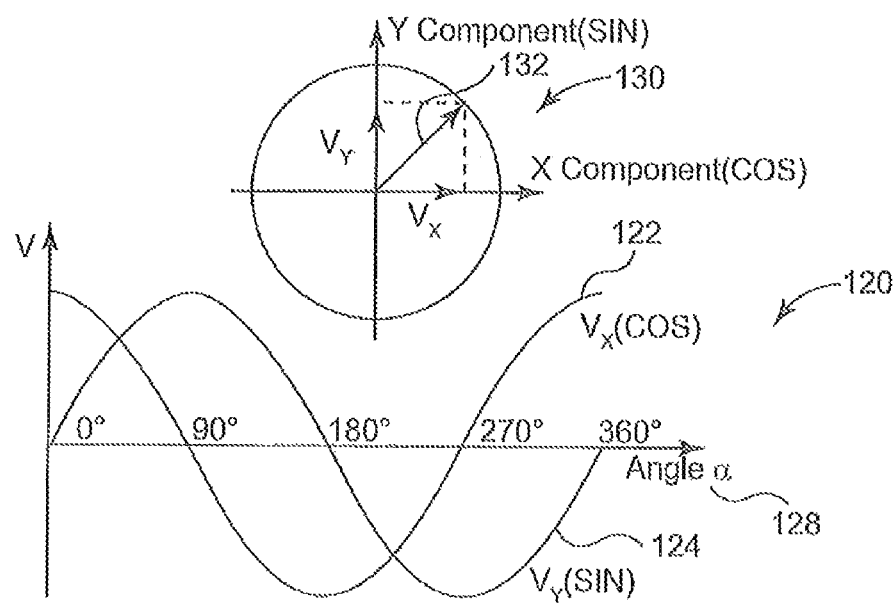
FIG. 5 is a graph illustrating examples of output curves provided by the GMR angle sensor of FIG. 3.

FIG. 5 is a graph 120 illustrating an "ideal" output signals $V_X(COS)$ 122 and $V_Y(SIN)$ 124 provided by GMR angle sensor 40 based respectively on voltage signals $V_X+$ and $V_X-$ and voltage signals $V_Y+$ and $V_Y-$ as magnetic field 98 rotates from 0-360 degrees, as indicated by the angle α at 128. As illustrated by the graph at 130, output signals $V_X(COS)$ 122 and $V_Y(SIN)$ 124 respectively represent x- and y-components of a vector 132 indicative of the angular position of magnetic field 98. According to one embodiment, output signals $V_X(COS)$ 122 and $V_Y(SIN)$ 124 are provided to an external device which determines the angular position of magnetic field 98 based on the above relationship.

As mentioned above, graph 120 represents output signals $V_X(COS)$ 122 and $V_Y(SIN)$ 124 under ideal conditions. Under such ideal conditions, each of the GMR resistors 94a-94d and 96a-96d are identical, and GMR sensor bridges 90 and 92 are perfectly orthogonal to one another, for example, and output signals $V_X(COS)$ 122 and $V_Y(SIN)$ 124 provide an exact representation of the angular position of magnetic field 98. However, in reality, due to manufacturing tolerances, there are typically inherent variations between each of the GMR resistors 94a-94d and 96a-96d which can lead to amplitude and offset variation between output signals $V_X(COS)$ 122 and $V_Y(SIN)$ 124. Additionally, the directions of fixed magnetic field portions of GMR resistors 94a-94d and 96a-96d are not likely to be perfectly orthogonal to one another which can phase errors between output signals $V_X(COS)$ 122 and $V_Y(SIN)$ 124. These amplitude, offset, and phase error, in-turn, lead to errors in the determined angular position of the magnetic field, such as magnetic field 98.

According to one embodiment, GMR sensor 40 includes a plurality of GMR parameters which are employed, such as by controller 70 (see FIG. 3), to adjust and correct output signals $V_X(COS)$ 122 and $V_Y(SIN)$ 124 to compensate for such variations. According to one embodiment, such GMR parameters are dynamically adjustable, such as via an input pin of GMR sensor 40, and values of GMR parameters 74 are stored in memory 72. Such GMR parameters include adjustable amplitude and offset parameters for each of the output signals $V_X(COS)$ 122 and $V_Y(SIN)$ 124, and an orthogonality parameter to adjust the phase of either $V_X(COS)$ 122 or $V_Y(SIN)$ 124. The amplitude and offset parameters are employed to substantially equalize the amplitudes of $V_X(COS)$ 122 and $V_Y(SIN)$ 124, and the orthogonality parameter is adjusted to as to maintain a substantially 90-degree phase shift between $V_X(COS)$ 122 and $V_Y(SIN)$ 124.

Figure 6:
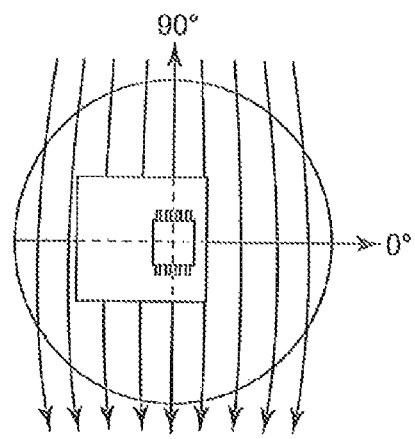
FIG. 6 is a diagram illustrating an example of a GMR sensor positioned at a center of rotation of a magnet according to one embodiment.

With reference to FIG. 1, one difficulty associated with positioning GMR angle sensor 40 off-center from permanent ring magnet 32 is that magnetic field lines at the perimeter of the magnet are bent or curved. In contrast, as illustrated by FIG. 6, when the GMR resistor region 44 of GMR sensor 40 is centered on an axis of rotation of a permanent magnet, such as that of an example pill-type permanent magnet 132 embedded in an end of a rotating shaft, such as rotating shaft 38, the magnetic field lines passing through GMR resistor region 44 are substantially linear and uniform. However, as illustrated by FIG. 1, when GMR resistor region 44 of GMR sensor 40 is positioned off-center from the axis of rotation of a permanent magnet, such as illustrated by FIG. 1, the magnetic field lines passing through GMR resistor region 44, such as magnetic field line 42a, are curved and not uniformly spaced. This non-uniformity of the magnetic field can cause errors in output signals $V_X(COS)$ 122 and $V_Y(SIN)$ 124 generated by GMR angle sensor 40 which, in-turn, cause errors in the measured angle of the rotating shaft to which the permanent magnet is attached, such as rotating shaft 38 to which permanent ring magnet 32 is coupled.

Figure 7:
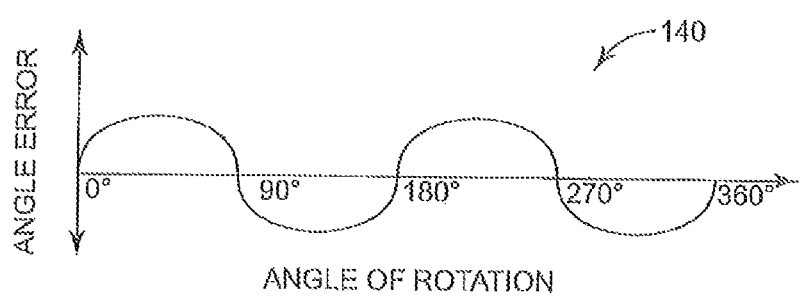
FIG. 7 is a graph of angle error from non-uniform magnetic field.

FIG. 7 is a graph 140 illustrating an example of an angle error in the angular position of rotating shaft 38 measured by GMR angle sensor 40 of FIG. 1 and caused by the non-uniformity of the magnetic field at the perimeter of permanent ring magnet 32. As apparent from graph 140, the resulting angle error of curve is approximately sinusoidal in shape over a 360-degree rotation of the rotating shaft. It is noted, however, that errors in the measured angular position of rotating shaft 38 by GMR angle sensor 40 due to inherent amplitude and orthogonality variations between GMR sensor bridges, such as GMR sensor bridges 90 and 92 (and due to variations in the physical construction of GMR angle sensor 40) are also sinusoidal in nature.

Figure 8:
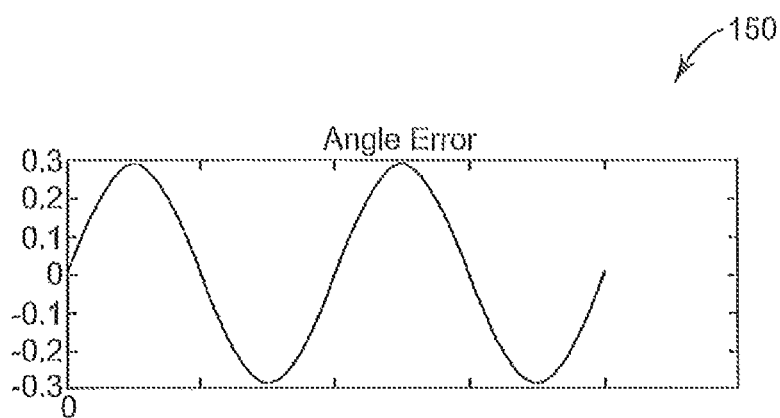
FIG. 8 is a graph of simulated error caused by adjusting amplitude parameters.

For example, FIG. 8 is a graph 150 of a simulated error resulting from an amplitude difference between output signals $V_X(COS)$ 122 and $V_Y(SIN)$ 124. The simulation was performed by setting the GMR amplitude parameters to values which create a 1% difference in amplitude between $V_X(COS)$ 122 and $V_Y(SIN)$ 124 with no offset or orthogonality variations. As illustrated by graph 150, the resulting error in the angle measured by GMR angle sensor 40 is sinusoidal in nature over a 360-degree rotation of the magnetic field, with a 1% amplitude resulting in an error varying between 0 and 0.3%.

Figure 9:
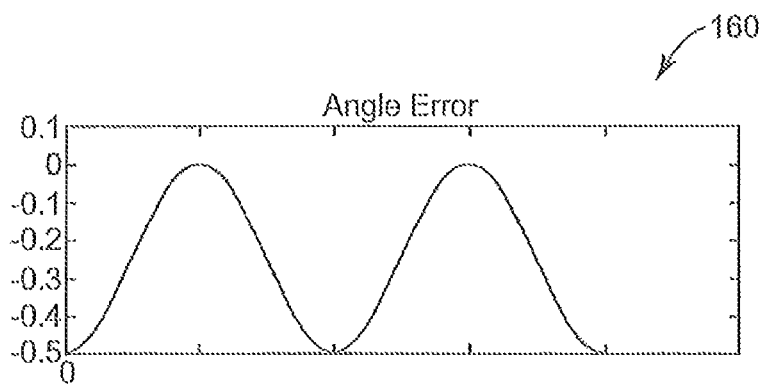
FIG. 9 is a graph of simulated error caused by adjusting orthogonality parameter.

Similarly, FIG. 9 is a graph 160 of a simulated error resulting from a phase error between output signals $V_X(COS)$ 122 and $V_Y(SIN)$ 124. The simulation was performed by setting the orthogonality parameter to a value which creates a 0.5-degree variation from a 90-degree phase difference between $V_X(COS)$ 122 and $V_Y(SIN)$ 124 with no amplitude or offset variations. Again, as illustrated by graph 160, the resulting error in the angle measured by GMR angle sensor 140 is sinusoidal in nature over a 360-degree rotation of the magnetic field, with a 0.5-degree orthogonality error resulting in an error varying between 0 and 0.5%.

According to one embodiment, based on the similar sinusoidal nature of the error in the angle measured by GMR angle sensor 40 resulting from the physical variations between the GMR resistors and GMR sensor bridges and from the non-uniformity of the magnetic field, during a calibration procedure, the GMR parameters of a GMR angle sensor of an off-center GMR angle measuring system, such as GMR angle sensor 40 of off-center GMR angle measuring system 30 of FIG. 1, are adjusted to compensate for errors resulting from the non-uniformity of the off-center magnetic field as well as for error due to amplitude and orthogonality variations.

According to one embodiment, during such a calibration procedure of an off-center angle measurement system, such as off-center GMR angle-measurement system 30 of FIG. 1, rotating shaft 38 is driven so that the angular position of rotating shaft 38 is at a known or actual position during rotation, such as through use of a toothwheel or polewheel based angle measurement system which is temporarily coupled to rotating shaft 38. The angular position of rotating shaft 38 as measured by GMR angle sensor 40 is then compared to the actual position and the values of GMR parameters 74 are adjusted until an error between the angular position of rotating shaft 38 as measured by GMR angle sensor 40 and the actual position is substantially minimized. Again, by adjusting the GMR parameters of GMR angle sensor 40 in this fashion, errors in the angular position as measured by GMR angle sensor 40 resulting from both physical variations of the GMR resistors and GMR sensor bridges and from variations due the non-uniformity of the off-center magnetic field are substantially corrected.

Figure 10:
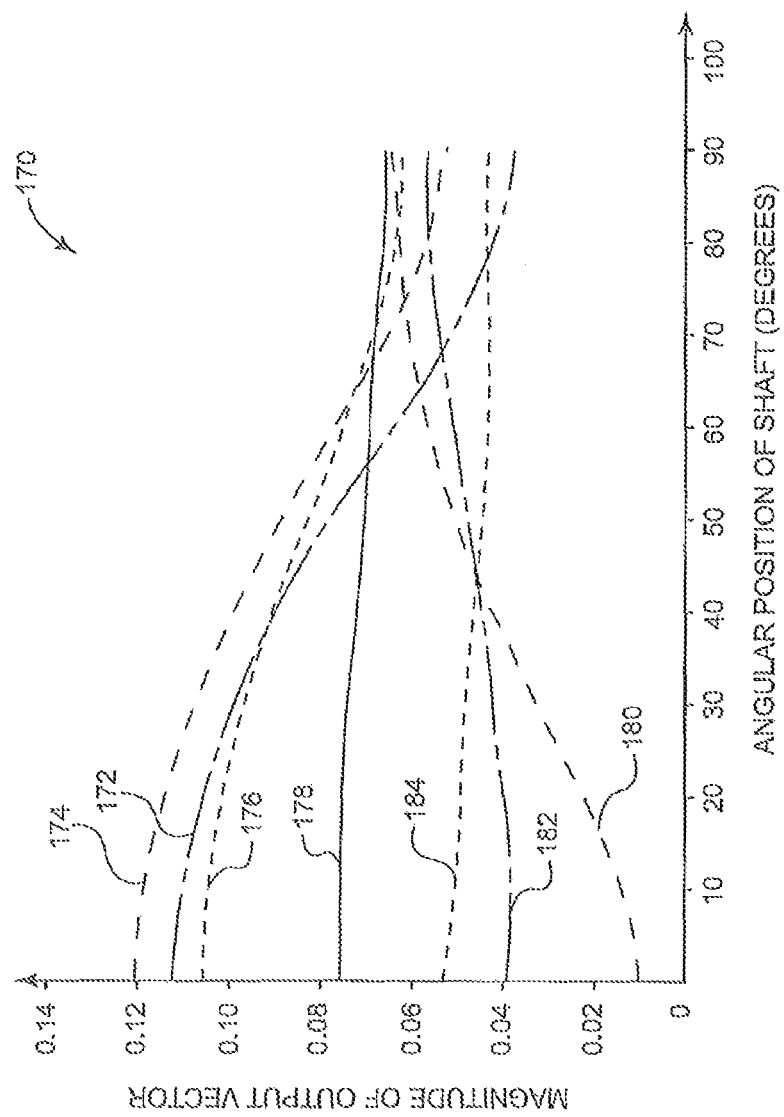
FIG. 10 is graph of error caused by radial position relative to magnet.

Due to the off-center variations in the magnetic field of the magnet, such as ring magnet 32, the accuracy of the angular position of rotating shaft 38 as measured by GMR angle sensor 40 is also influenced by the position of GMR angle sensor 40 between inner radius 56 and outer radius 58 of permanent ring magnet 32. FIG. 10 is a graph illustrating examples of the magnitude of output vector 142 resulting from GMR angle sensor 40 output signals Vx(COS) 122 and Vy(SIN) 124 when disposed at different positions along x-axis 50 between inner radius 56 and outer radius 58 as shaft 38 rotates over a range of 90-degrees (i.e. 0-90 degrees). In the illustrated example of FIG. 10, ring magnet 32 has an inner radius 56 of 3 mm, and outer radius of 8 mm, and a thickness of 3 mm, with GMR angle sensor 40 being positioned 1.5 mm from surface 48.

Curves 172, 174, 176, 178, 180, 182, and 184 respectively illustrate the magnitude of output vector 142 when GMR angle sensor 40 is positioned at radii of 4 mm, 5 mm, 6 mm, 7 mm, 8 mm, 9 mm, and 10 mm from a center of ring magnet 32. As illustrated by the curves of graph 170, the magnitude of output vector 142 varies as ring magnet 32 rotates with shaft 38, which can cause errors in the angle measurement provided by GMR angle sensor 40. The errors in the angle measurement provided by GMR angle sensor 40 can be reduced by positioning GMR angle sensor at the radial location which results in the least variation in the magnitude of output vector 142. In the example illustrated by FIG. 10, a radial position of 7 mm from a center of ring magnet 32 provides the least amount of variation in magnitude of output vector 142 and represents the best radial location at which to position GMR angle sensor 40.

In view of the above, according to one embodiment, during a calibration procedure of an off-center angle measurement system, such as off-center GMR angle-measurement system 30 of FIG. 1, a radial position of GMR angle sensor 40 relative to ring magnet 32 is adjusted to determine the location which provides the least amount of variation in output vector 142. Such a position corresponds to the position between inner radius 54 and outer radius 56 at which the magnetic field of ring magnet 32 is most uniform.

Figure 11:
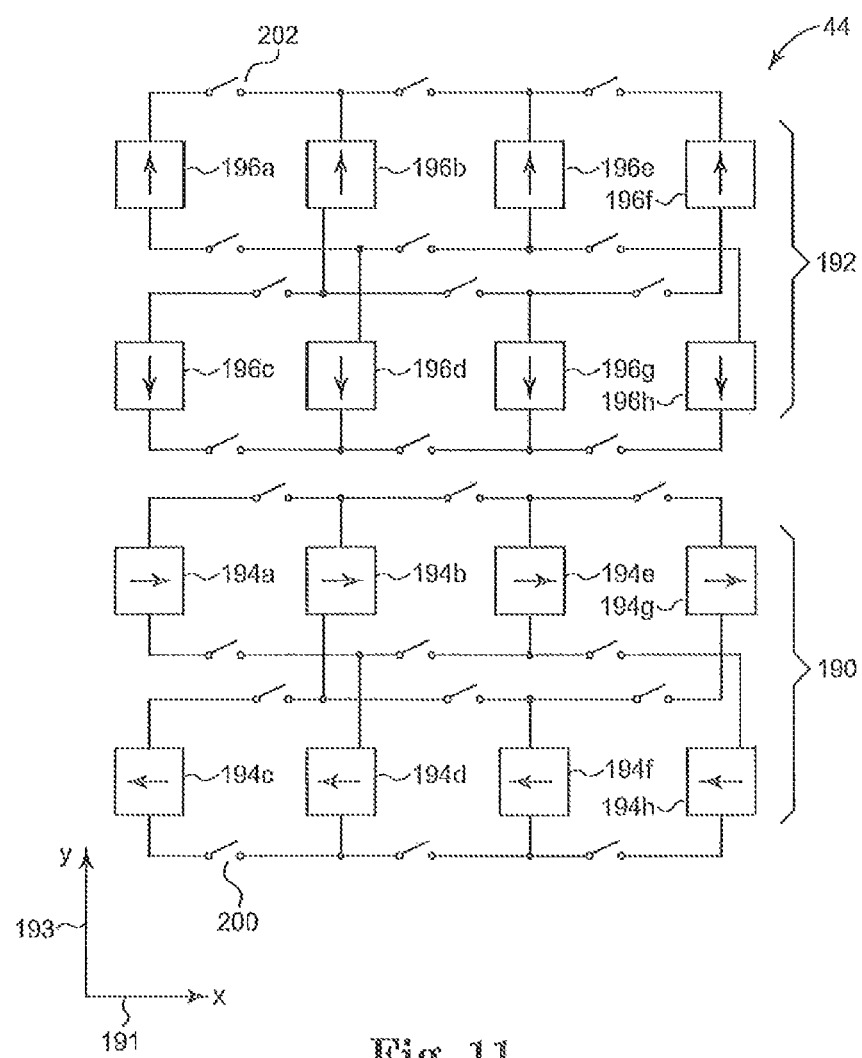
FIG. 11 is schematic diagram of an array of GMR resistors according to one embodiment.

As illustrated by FIG. 11, according to one embodiment, GMR resistor region 44 includes a first plurality of GMR resistors 190, including GMR resistors 194a-194h, having fixed magnetic field portions fixed along an x-axis 192, for example (as indicated by the horizontal arrows in FIG. 11), and a second plurality of GMR resistors 192, including GMR resistors 196a-196h, having fixed magnetic field portions fixed along a y-axis 193, for example (as indicated by the vertical arrows in FIG. 11). The first plurality of GMR resistors 190 can be selectively interconnected by an associated plurality of externally controllable switches, as illustrated by switch 200, and the second plurality of GMR resistors 192 can be selectively interconnected by an associated plurality of externally controllable switches, as illustrated by switch 202, to form different GMR sensor bridge configurations (e.g. GMR sensor bridges 90 and 92 of FIG. 4) at different positions along x-axis 191.

Figures 12A, 12B:
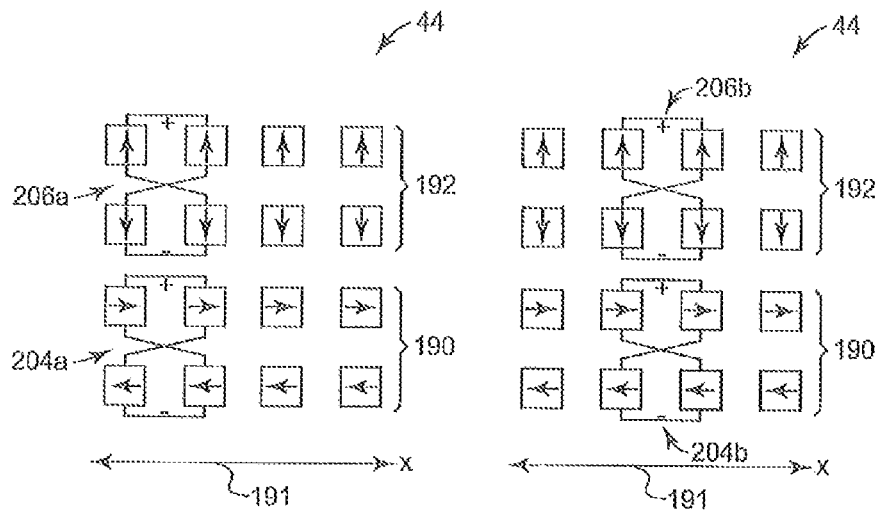
FIGS. 12A through 12C illustrate examples of GMR sensor bridge configurations according to one embodiment.
Figure 12C:
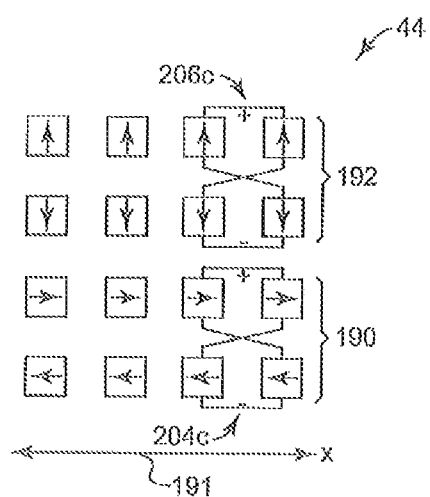

For example, as illustrated by FIG. 12A, GMR resistors 194a-194d and 196a-196d forming the left-most columns of GMR resistor region 44 are respectively interconnected via the associated externally controllable switches to form GMR sensor bridges 204a and 206a at a left-most position along x-axis 190 within GMR angle sensor 40. Similarly, as illustrated by FIG. 12B, GMR resistors 194b, 194d, 194e, and 194f and 196b, 196d, 196e, and 196f forming the center-most columns of GMR resistor region 44 are respectively interconnected via the associated externally controllable switches to form GMR sensor bridges 204b and 206b at a central position along x-axis 190 within GMR angle sensor 40. Also, as illustrated by FIG. 12C, GMR resistors 194e-194h and 196e-196h forming the right-most columns of GMR resistor region 44 are respectively interconnected via the associated externally controllable switches to form GMR sensor bridges 204c and 206c at a right-most position along x-axis 190 within GMR angle sensor 40.

By selecting which GMR resistors 94a-94h and 96a-96h are connected to form the GMR sensor bridges, the radial position of the GMR sensor bridges of GMR angle sensor 40 relative to ring magnet 32 can be further, and more finely, adjusted to determine a location which provides the least amount of variation in the magnitude of output vector 142.

Figure 13:
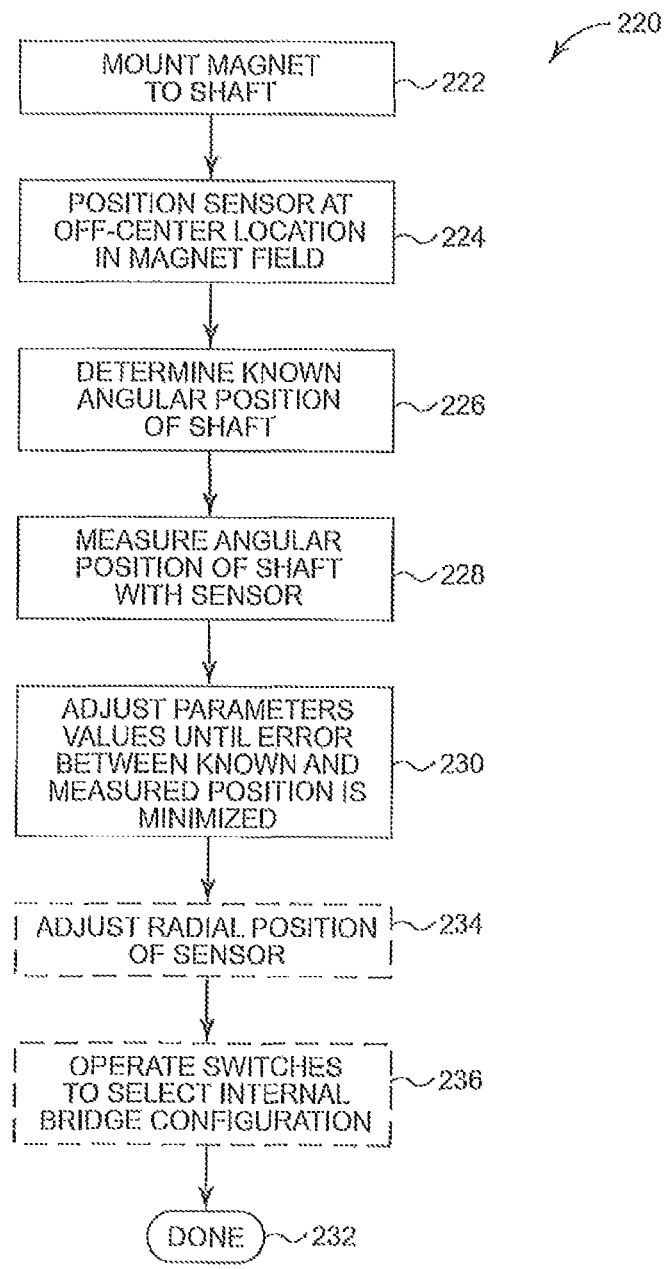
FIG. 13 is a flow diagram illustrating an operating and calibration procedure according to one embodiment.

FIG. 13 is a flow diagram generally illustrating a process 220 for calibrating and operating an off-center angle measurement system according to one embodiment. Process 220 begins at 222 with the mounting of a magnet to a rotating shaft, such as rotating shaft 38, wherein the magnet provides a magnetic field which rotates with the shaft about a rotational axis of the shaft. In one embodiment, the magnet comprises a ring magnet, such as ring magnet 32, mounted about the shaft remote from ends of the shaft.

At 224, an integrated circuit magnetoresistive angle sensor, such as GMR angle sensor 40, is positioned in the magnetic field at a radially off-center position from the axis of rotation. According to one embodiment, the integrated circuit magnetoresistive angle sensor, includes first and second magnetoresistive sensing bridges respectively providing first and second signals representative of orthogonal first and second directional components of the magnetic field. According to one embodiment, the integrated circuit angle sensor includes a set of adjustment parameters for adjusting attributes of the first and second signals. In one embodiment, the set of adjustment parameters includes a first and a second amplitude parameter and a first and a second offset parameter for respectively adjusting an amplitude and an offset of the first and second signals. In one embodiment, the set of adjustment parameters further includes an offset parameter for one of the first and second signals to adjust a phase of the one of the first and second signals. In one embodiment, the first and second magnetoresistive sensing bridges comprises giant magnetoresistive elements. In one embodiment, the first and second magnetoresistive sensing bridges comprises anisotropic magnetoresistive elements.

At 226, a "known" angular position of the shaft is measured, such as by using a discrete-type angle sensor, such as a conventional toothwheel- or polewheel-based angle sensor, for example, which is temporarily coupled to the rotating shaft. At 228, the angular position of the rotating as measured by the integrated circuit magnetoresistive angle sensor, the "measured" angular position, is determined from the first and second signals.

At 230, the values of the set of adjustment parameters are adjusted to modify attributes of the first and second signals to compensate for errors in the measured angular position resulting from structural inaccuracies between the magneto resistive elements of the first and second bridges and from non-uniformity of the magnetic field at the off-center position until an error between the "known" angular position determined at 226 and the "measured" angular position from determined from the integrated circuit at 228 is substantially minimized.

According to one embodiment, process 220 is then complete, as indicated at 232. However, according to one embodiment, as illustrated by the dashed lines at 234, process 220 additionally includes adjusting the radial position of the integrated circuit until variations in a magnitude of a vector based on the first and second signals are substantially minimized.

According to one embodiment, such as described above by FIGS. 11 and 12A-12C, the integrated circuit magnetoresistive angle sensor includes a first set of magnetoresistive elements and an associated first plurality of switches which can be operated to selectively interconnect different subsets of the first set of magnetoresistive elements to form the first magnetoresistive sensing bridge at different positions within the integrated circuit, and a second set of magnetoresistive elements and an associated second plurality of switches which can be operated to selectively interconnect different subsets of the second set of magnetoresistive elements to form the second magnetoresistive sensing bridge at different positions within the integrated circuit.

According to one embodiment, as illustrated by the dashed lines at 236, process 220 includes adjustment of the radial position by operating the first and second pluralities of switches such that the resulting first and second magnetoresistive sensing bridges are at positions within the integrated circuit such that the variations in the magnitude of the vector are substantially minimized.

Figure 14:
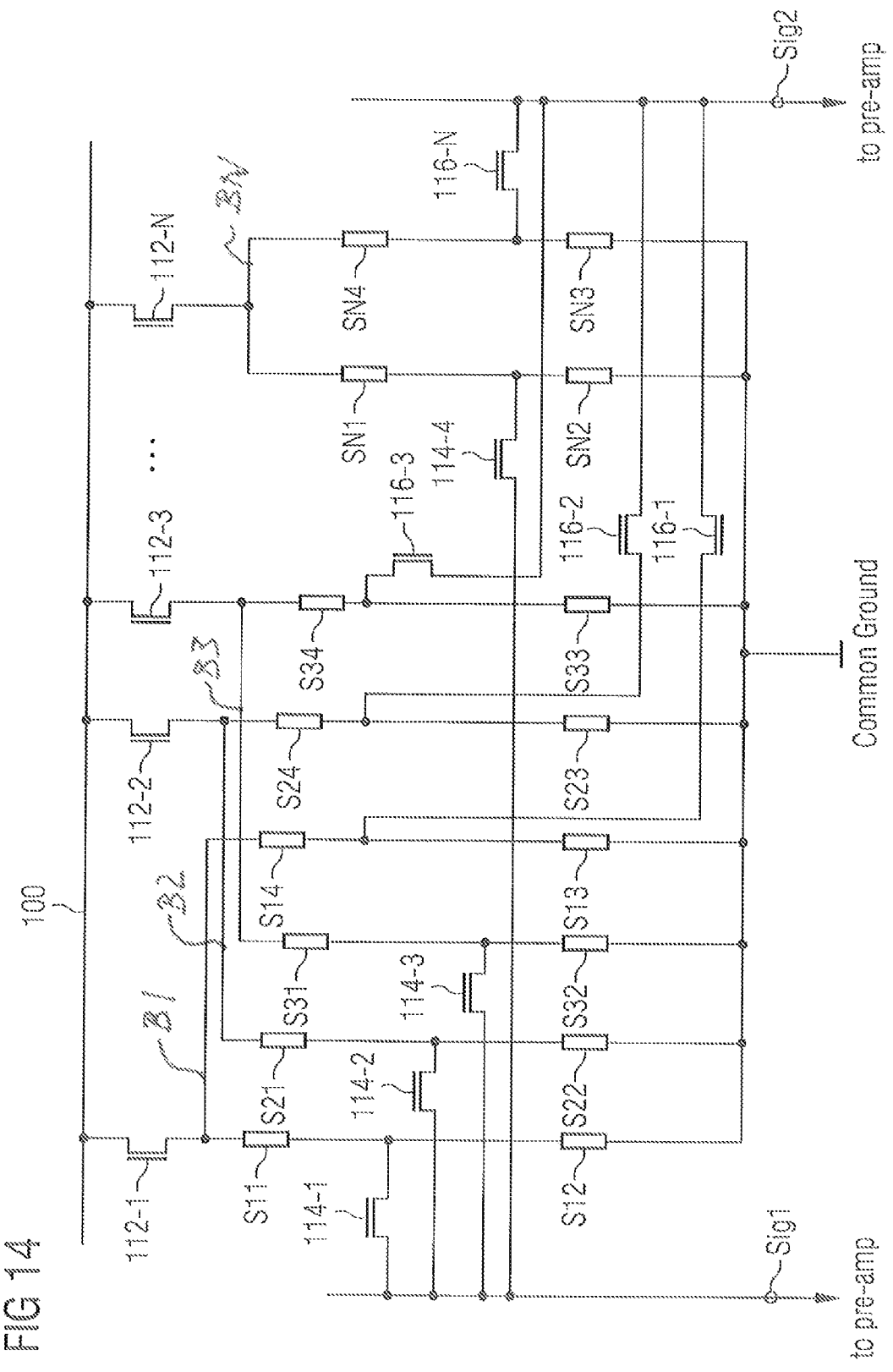
FIG. 14 illustrates one example of an integrated circuit according to one embodiment.

FIG. 14 illustrates one embodiment of an integrated circuit for measuring an angular position of a magnetic object rotating around an axis. The integrated circuit illustrated in FIG. 14 is configured for measuring the angular position from an off-axis position; this is to say that the integrated circuit according to FIG. 14 does not need to be placed with its sensor elements at a position along the rotation axis. A person of ordinary skill in the art will readily understand that methods and techniques described above may be also implemented using the integrated circuit according to the invention as illustrated in FIG. 14.

The integrated circuit of FIG. 14 illustrates a plurality of switching elements 112-1, 112-2, . . . 112-N; 114-1, 114-2, . . . , 114-N; and 116-1, 116-N in combination with a plurality of sensing elements Sxy, as shall be explained in more detail below.

From a supply rail 100 individual switching elements 112-1, 112-2, ..., 112-N out of the plurality of switching elements provide a switchable connection to individual ones of sensing bridges B1, B2, B3, ..., BN. Although the supply rail 100 is indicated as a common supply rail 100, there may without any limitation individual supply rails present instead.

The individual sensing bridges B1, B2, B3, ..., BN are formed by sensing elements Sxy. FIG. 14 depicts four examples of individual sensing bridges with the individual sensing elements Sxy for which the index x runs from 1 to N. Each of the individual sensing bridges B1, B2, B3, ..., BN comprises four individual sensing elements as indicated by the index y running from 1 to 4. Therefore the first individual sensing bridge B1 is formed by a first individual sensing element S11, a second individual sensing element S12, a third individual sensing element S13 and fourth individual sensing element S14. The other sensing bridges B2, B3, ..., BN are labelled accordingly.

In the exemplary embodiment of FIG. 14 the individual sensing bridges B1, B2, B3, ..., BN share a common ground. It is to be understood however that this is an optional choice and by no means limiting to the present invention.

Between the first sensing element Sx1 and the second sensing element Sx2 of each individual sensing bridge B1, B2, ..., BN a first signal Sig1 may be tapped using a first signal switch 114-1, 114-2, ..., 114-N, respectively. This is to say the first signal switches 114-1, 114-2, ..., 114-N provide a switchable connection from each of the individual sensing bridges B1, B2, ..., BN to a pre-amplifier (not shown) The first signal Sig1 may be representative of a first directional component of the magnetic field sensed by one of the individual sensing bridges B1, B2, B3, ..., BN due to the rotating object, such as the ring magnet 32, but is not limited thereto. It is to be understood that the first directional component represented by the first signal may however vary from one sensing bridge to another one of the sensing bridges.

It is further conceivable to replace the first signal switches 114-1, 114-2, ..., 114-N by a non-switchable connection, respectively to the line delivering the first signal Sig1 to a pre-amplifier (not shown). For such a setup it would be of interest to select individual ones of the sensing bridges B1, B2, B3, ..., BN by switching one of the switches 112-1, 112-2, 112-3, ..., 112-N ON, while the others are set to an OFF state.

Similar to the first signal switches as explained above, FIG. 14 illustrates second signal switches 115-1, 116-2, 116-3, ..., 116-N providing a switchable connection from an individual one of the sensing bridges B1, B2, B3, ..., BN to a line forwarding a second signal Sig2 to a further pre-amplifier (not illustrated). It is convenient to tap the second signal Sig2 between the third sensing element Sx3 and the forth sensing element Sx4 of an individual sensing bridge B1, B2, B3, ..., BN selected by one of the switching elements 112-1, 112-2, 112-3, ..., 112-N. The second signal Sig2 is typically representative of a second directional component of the magnetic field generated by the rotating object, as was already explained above with regards to the other embodiments. The second directional component may without limitation be perpendicular to the first directional component for which the first signal Sig1 is representative. As explained before, it is to be understood that the second directional component represented by the second signal Sig2 may however vary from one sensing bridge to another one of the sensing bridges. It may be convenient to provide the first signal Sig1 and the second signal Sig2 representing substantially orthogonal directional components of the magnetic field within an individual one of the sensing bridges.

As already explained for the first signal switches alternatively or additionally the second signal switches 116-1, 116-2, 116-3, ..., 116-N may be replaced by a non-switchable connection from the individual sensing bridge B1, B2, B3, ..., BN to the line forwarding the second signal Sig2 to the pre-amplifier (not illustrated).

The integrated circuit of FIG. 14 is different than the embodiment pertaining to FIG. 11 with regards to an RDS ON of individual switches within sensing bridges of FIG. 11 may affect a performance of the sensing bridges and consequently affect a sensitivity of the integrated circuit. The integrated circuit disclosed in FIG. 14 however does not contain any switching elements within an individual sensing bridge S1, S2, S3, ..., SN so that the RDS ON of the individual switches should not affect the performance of the sensing bridges.

A person of ordinary skill will readily appreciate that the individual sensing bridges S1, S2, S3, ..., SN may be distributed over the integrated circuit in a suitable manner. The interdigital arrangement of sensing bridges S1, S2 and S3 illustrated in FIG. 14 shall therefore be considered as a non-limiting example. As a further example of distributing the sensing bridges, the sensing bridge SN is depicted on the right of FIG. 14, while the sensing bridges S1, S2, and S3 are depicted on the left side of FIG. 14. Distributing the individual sensing bridges S1, S2, S3, ..., SN may be of interest in order to minimize errors that may be caused by non-uniformity of the magnetic field at the off-axis position. Other spatially varying errors of the sensed magnetic field may be minimized by using a selected one of the sensing bridges S1, S2, S3, ..., SN. Hence all techniques and methods for minimizing errors explained above may be implemented with regards to the integrated circuit of FIG. 14, too.

Figure 15:
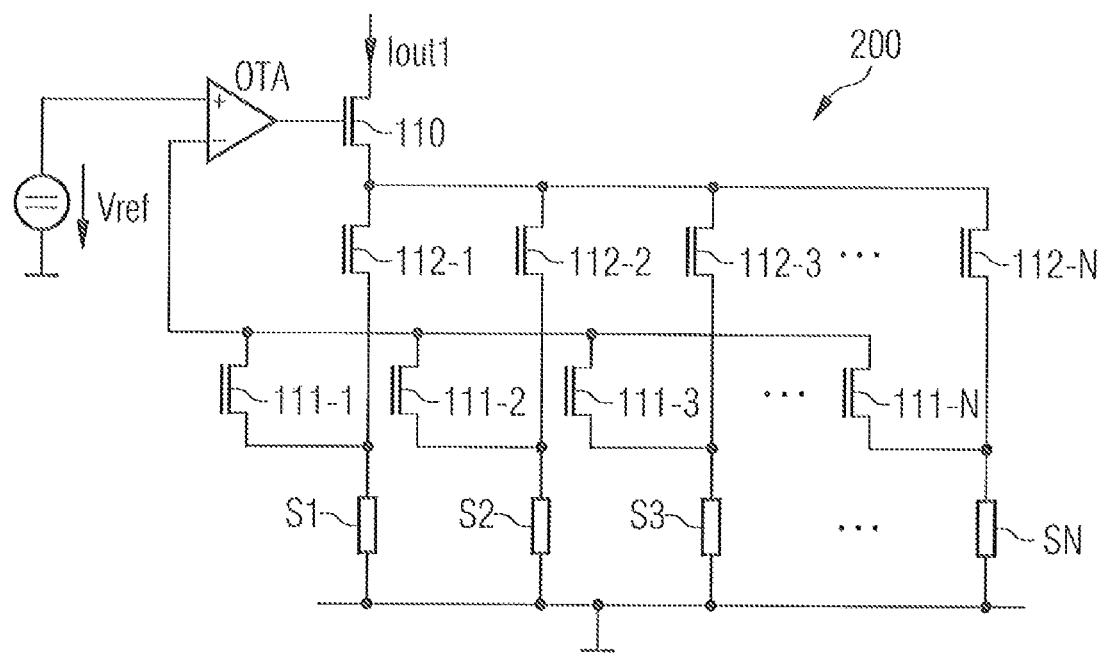
FIG. 15 illustrates one example of an integrated circuit according to another embodiment.

FIG. 15 illustrates a further embodiment of an integrated circuit 200. The integrated circuit illustrated in FIG. 15 may be operated in a current mode, which is different than the integrated circuits described before, including the integrated circuit of FIG. 14 operated in voltage mode.

An individual switch 112-1, 112-2, 112-3, 112-N out of a plurality of switches is provided to select an individual sensing element out of a plurality of sensing elements S1, S2, S3, ..., SN. A voltage controlled current source, for example the operational transductance stage OTA, may be used in combination with a regulating switch 110 for regulated coupling a current Iout1 to the selected one of the individual sensing elements S1, S2, S3, ..., SN. Other means of (regulated) coupling the current Iout1 to the selected one of the individual sensing elements S1, S2, S3, ..., SN are conceivable.

A feedback loop for each of the individual sensing elements S1, S2, S3, ..., SN may be provided in order to regulate a voltage across the selected one of the sensing elements S1, S3, S3, ..., SN. In the embodiment of FIG. 15 the feedback loop is formed by second switches 111-1, 111-2, 111-3, ..., 111-N switchably coupling to a feedback path leading to an (inverted) input of the operational transductance stage OTA. With such a setup it is convenient to regulate the voltage across the selected one of the sensing elements S1, S2, S3, ..., SN. There are various other feedback scenarios conceivable in order to regulate the voltage and/or a current through the selected one of the sensing elements S1, S2, S3, ..., SN.

Figure 16:
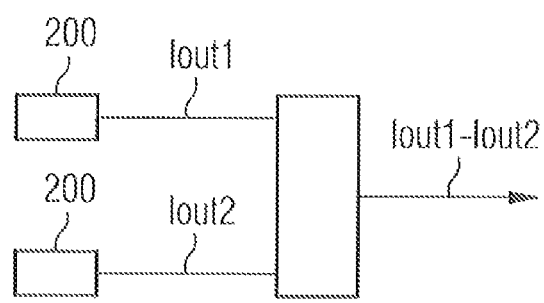
FIG. 16 illustrates one example of integrated circuits according to another embodiment.

The sensing elements S1, S2, S3, ..., SN share a common ground plate in the setup of FIG. 16, this is however a design choice not relevant to working the present invention.

FIG. 16 illustrates a setup using several of the integrated circuits explained with respect to FIG. 15. It may be of interest to select the sensing elements S1, S2, S3, ..., SN of the first integrated circuit 200 (for example the top one in FIG. 16) to provide a first signal Iout1. The second integrated circuit of FIG. 16 may instead provide a current Iout2. When performing a subtraction of these signals, as indicated in FIG. 16, one may implement a differential sensing behavior of the integrated circuits 200.

Additionally or alternatively one may arrange the sensing elements S1, S2, S3, ..., SN of the first integrated circuit 200 (say the top one in FIG. 16) such that the first signal Iout1 corresponds to a first spatial component of the magnetic field caused by the magnetic field of rotating object, as explained above. The sensing elements S1, S2, S3, ..., SN of the second integrated circuit 200 (the lower one of FIG. 16) may instead provide a signal Iout2 corresponding to a second signal, as explained before, i.e. corresponding to a second spatial component of the magnetic field caused by the magnetic field of the rotating object.

A person of ordinary skill in the art will readily appreciate that the techniques and methods disclosed with regards to the other embodiments may also be implemented using the integrated circuit as illustrated in FIGS. 15 and 16.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit for measuring an angular position of a magnetic object rotating around an axis from an off-axis position, the integrated circuit comprising:
    a plurality of magnetic sensing elements; and
    a plurality of switches configured to select a subset of one or more sensing elements out of the plurality of magnetic sensing elements, the subset of sensing elements providing a first signal representative of a first directional component of a magnetic field caused by the rotating magnetic object, each of the switches of the plurality of switches being disposed outside of connection paths between any sensing elements of the selected subset of sensing elements.

2. The integrated circuit according to claim 1, wherein the subset of magnetic sensing elements further provides a second signal representative of a second directional component of the magnetic field caused by the rotating magnetic object.

3. The integrated circuit according to claim 2, wherein the subset of sensing elements is configured to form a first sensing bridge providing the first and second signal when selected by the plurality of switches.

4. The integrated circuit according to claim 3, wherein switching at least a selected one out of the plurality of switches causes a switching from the subset of sensing elements to another subset of sensing elements out of the plurality magnetic sensing elements, the another subset of sensing elements providing a third signal representative of a third directional component of the magnetic field caused by the rotating magnetic object.

5. The integrated circuit according to claim 4, wherein the third directional component is substantially parallel to the first directional component or the second directional component of the magnetic field caused by the rotating magnetic object.

6. The integrated circuit according to claim 4, wherein the subset of sensing elements and the another subset of sensing elements share a common ground plane.

7. The integrated circuit according to claim 4, wherein the another subset of magnetic sensing elements provides a fourth signal representative of a further directional component of the magnetic field caused by the rotating magnetic object, the further directional component being substantially perpendicular to the third directional component of the magnetic field caused by the rotating magnetic object.

8. The integrated circuit according to claim 7, wherein the another subset of sensing elements is configured to form a second sensing bridge providing the third and fourth signal when selected by the plurality of switches.

9. The integrated circuit according to claim 8, wherein the first sensing bridge and the second sensing bridge are arranged at least partially overlapping.

10. The integrated circuit according to claim 2, wherein the second directional component of the magnetic field is substantially orthogonal to the first directional component of the magnetic field.

11. The integrated circuit according to claim 1, wherein individual ones of the plurality of magnetic sensing elements are selected from the group consisting of GMR sensing elements, TMR sensing elements, and AMR sensing elements, horizontal Hall sensing elements, and vertical Hall sensing elements.

12. The integrated circuit according to claim 1, wherein individual ones of the subset of sensing elements share a common ground plate.

13. The integrated circuit according to claim 1, further comprising a voltage controlled current source coupled to a feedback loop, wherein the voltage controlled current source is configured to control a voltage across the subset of sensing elements.

* * * * *